(12) United States Patent
van Beek et al.

(10) Patent No.: US 10,649,585 B1
(45) Date of Patent: May 12, 2020

(54) ELECTRIC FIELD SENSOR

(71) Applicant: NXP B.V., Eindhoven (NL)

(72) Inventors: Jozef Thomas Martinus van Beek, Rosmalen (NL); James Raymond Spehar, Chandler, AZ (US); Kim Phan Le, Eindhoven (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/242,116

(22) Filed: Jan. 8, 2019

(51) Int. Cl.
*H01Q 13/20* (2006.01)
*H01Q 13/28* (2006.01)
*G06F 3/042* (2006.01)
*H01Q 1/24* (2006.01)
*H03K 17/955* (2006.01)
*H04B 1/02* (2006.01)
*H01Q 21/06* (2006.01)
*H01Q 13/08* (2006.01)
*H01Q 3/44* (2006.01)

(52) U.S. Cl.
CPC ............ *G06F 3/0428* (2013.01); *H01Q 1/24* (2013.01); *H01Q 21/061* (2013.01); *H03K 17/955* (2013.01); *H04B 1/02* (2013.01); *G06F 2203/04109* (2013.01); *H01Q 1/243* (2013.01); *H01Q 3/44* (2013.01); *H01Q 13/08* (2013.01); *H01Q 13/20* (2013.01); *H01Q 13/28* (2013.01); *H03K 2217/960755* (2013.01)

(58) Field of Classification Search
CPC ........ G06F 3/0428; G06F 2203/04109; H01G 1/24; H01G 1/243; H01G 3/44; H01G 13/08; H01G 13/20; H01G 13/28; H01G 21/061; H03K 17/955; H03K 2217/960755; H04B 1/02
See application file for complete search history.

(56) References Cited

U.S. PATENT DOCUMENTS

| | | | | |
|---|---|---|---|---|
| 4,509,209 A | * | 4/1985 | Itoh ......................... | H01Q 1/247 343/700 MS |
| 5,486,832 A | * | 1/1996 | Hulderman ............. | G01S 7/032 342/175 |
| 5,745,082 A | * | 4/1998 | Alder ...................... | H01Q 3/44 343/753 |
| 6,249,242 B1 | * | 6/2001 | Sekine .................... | G01S 7/032 342/175 |
| 8,374,660 B1 | * | 2/2013 | Steigerwald ........... | H01Q 1/243 343/841 |
| 2001/0049266 A1 | * | 12/2001 | Hayata ................... | H01Q 13/06 455/81 |
| 2004/0116157 A1 | * | 6/2004 | Vance .................... | H01Q 1/243 455/562.1 |

(Continued)

OTHER PUBLICATIONS

J. Ruan, et al. "A multi-touch interface circuit for a large-sized capacitive touch panel," Sensors, 2010 IEEE, Kona, HI, 2010, pp. 309-314. (doi: 10.1109/ICSENS.2010.5689881).

(Continued)

*Primary Examiner* — Michael J Eurice (57) ABSTRACT

An electric field sensor including a dielectric layer having a plane surface, at least one transceiver antenna disposed on one side of the dielectric layer, the at least one transceiver antenna configured to emit a wave above the plane surface of the dielectric layer and detect an event adjacent the plane surface, an integrated circuit coupled to the at least one transceiver antenna.

20 Claims, 8 Drawing Sheets

(56) References Cited

U.S. PATENT DOCUMENTS

| | | | | |
|---|---|---|---|---|
| 2005/0085209 | A1* | 4/2005 | Hiramatsu | H01P 3/165 455/328 |
| 2005/0264452 | A1* | 12/2005 | Fujishima | H01Q 1/243 343/700 MS |
| 2006/0164104 | A1* | 7/2006 | Tada | G01B 15/02 324/646 |
| 2007/0152898 | A1* | 7/2007 | Mizuno | H01Q 1/18 343/767 |
| 2009/0207090 | A1* | 8/2009 | Pettus | H01L 23/66 343/873 |
| 2011/0163921 | A1* | 7/2011 | Chirila | H01Q 5/364 343/702 |
| 2011/0230136 | A1* | 9/2011 | Washiro | H01P 5/187 455/41.1 |
| 2011/0248724 | A1* | 10/2011 | Sekiguchi | H01Q 1/248 324/633 |
| 2012/0038520 | A1* | 2/2012 | Cornwell | H01Q 1/24 343/702 |
| 2012/0313895 | A1* | 12/2012 | Haroun | G06F 3/0421 345/175 |
| 2013/0135259 | A1* | 5/2013 | King | G06F 3/0421 345/175 |
| 2013/0300618 | A1* | 11/2013 | Yarga | H01Q 1/243 343/720 |
| 2014/0183441 | A1* | 7/2014 | Park | H01L 31/028 257/9 |
| 2014/0225129 | A1* | 8/2014 | Inoue | H01Q 1/1264 257/81 |
| 2015/0188218 | A1* | 7/2015 | Elsherbini | H01Q 1/2283 343/905 |
| 2015/0249485 | A1* | 9/2015 | Ouyang | H04B 5/0081 455/41.1 |
| 2015/0311960 | A1* | 10/2015 | Samardzija | H01Q 1/52 455/90.3 |
| 2016/0036122 | A1* | 2/2016 | Debray | H01Q 1/2283 250/338.1 |
| 2016/0181695 | A1* | 6/2016 | Mukherjee | H01Q 1/2216 343/866 |
| 2016/0308563 | A1* | 10/2016 | Ouyang | H04B 1/1081 |
| 2017/0036541 | A1* | 2/2017 | Brankovic | G08B 21/06 |
| 2017/0077588 | A1* | 3/2017 | Fukuda | H01Q 1/2216 |
| 2017/0153748 | A1* | 6/2017 | Choi | G06F 3/044 |
| 2017/0207514 | A1* | 7/2017 | Kamo | H01Q 1/1271 |
| 2017/0288305 | A1* | 10/2017 | Ohkoshi | H01Q 1/526 |
| 2017/0292920 | A1* | 10/2017 | Torun | G01N 22/00 |
| 2018/0033819 | A1* | 2/2018 | Goldberger | H01Q 21/062 |
| 2018/0138576 | A1* | 5/2018 | Cohen | H01Q 21/061 |
| 2018/0323498 | A1* | 11/2018 | Bean | H01Q 1/248 |
| 2018/0331429 | A1* | 11/2018 | Kornaros | H02J 50/12 |
| 2019/0113609 | A1* | 4/2019 | Baheti | H01Q 1/2283 |
| 2019/0131717 | A1* | 5/2019 | Vannucci | H04B 3/52 |
| 2019/0131718 | A1* | 5/2019 | Vannucci | H01Q 1/246 |
| 2019/0288383 | A1* | 9/2019 | Shiozaki | H01Q 1/42 |
| 2019/0302254 | A1* | 10/2019 | Maruyama | H01Q 21/08 |
| 2020/0008328 | A1* | 1/2020 | Hiroi | H01F 1/03 |

OTHER PUBLICATIONS

S. Hayashi, et al., "Terahertz-wave absorption in liquids measured using the evanescent field of a waveguide," 2009, 34th International Conference on Infrared, Millimeter, and Terahertz Waves, Busan, 2009, pp. 1-2.

* cited by examiner

ELECTRIC FIELD SENSOR

TECHNICAL FIELD

Example embodiments disclosed herein relate generally to an evanescent field sensor, and more particularly to the use an evanescent mm-wave above a dielectric sheet configured for detecting events in two dimensions that occur within an evanescent field.

SUMMARY

A brief summary of various example embodiments is presented below. Some simplifications and omissions may be made in the following summary, which is intended to highlight and introduce some aspects of the various example embodiments, but not to limit the scope of the invention. Detailed descriptions of example embodiments adequate to allow those of ordinary skill in the art to make and use the inventive concepts will follow in later sections.

Example embodiments include an electric field sensor including a dielectric layer having a plane surface, at least one transceiver antenna disposed on one side of the dielectric layer, the at least one transceiver antenna configured to emit a wave above the plane surface of the dielectric layer and detect an event adjacent the plane surface, and an integrated circuit coupled to the at least one transceiver antenna.

The at least one transceiver antenna may only be disposed along one side of the dielectric layer.

The at least one transceiver antenna may only be disposed along two sides of the dielectric layer.

A single transceiver antenna may be configured to emit a wave toward an event and receive a reflected wave from the event.

The at least one transceiver antenna may emit waves in a plurality of directions along the plane surface. The electric filed sensor may include a plurality of transceiver antennas to receive the waves.

The dielectric layer may be a glass sheet, ceramic sheet or a plastic sheet.

A strength of the wave may exponentially decay in a direction substantially perpendicular to the plane surface.

The at least one transceiver antenna may be configured to receive a portion of the wave after an event disturbs the wave.

The wave may transmit a disturbance from the event and a data message.

Example embodiments may include a method including arranging a plurality of transceiver antennas around a dielectric substrate, emitting at least one wave from each of the plurality of transceiver antennas, detecting a normal condition of the at least one wave, and detecting a disturbed condition of the at least one wave after the at least one wave has encountered an event adjacent the dielectric substrate.

The method may include emitting a plurality of waves from each of the plurality of transmitters Emitting the plurality of waves may be conducted in a sweeping fashion.

The waves may be controlled by an integrated circuit chip.

The method may include reflecting a wave off the event to detect the disturbed condition.

The at least one wave may be an evanescent wave that extends above a surface of the dielectric substrate.

The method may include detecting a plurality of disturbed conditions from a plurality of waves after the plurality of waves have encountered an event adjacent the dielectric substrate.

Detecting the disturbed condition may result from the at least one wave has encountering a human touch.

Detecting the disturbed condition may result from the at least one wave has encountering a liquid.

Detecting the disturbed condition may result from the at least one wave has encountering a defect in the dielectric substrate.

BRIEF DESCRIPTION OF THE DRAWINGS

Additional objects and features of the invention will be more readily apparent from the following detailed description and appended claims when taken in conjunction with the drawings. Although several example embodiments are illustrated and described, like reference numerals identify like parts in each of the figures, in which:

DETAILED DESCRIPTION

It should be understood that the figures are merely schematic and are not drawn to scale. It should also be understood that the same reference numerals are used throughout the figures to indicate the same or similar parts.

The descriptions and drawings illustrate the principles of various example embodiments. It will thus be appreciated that those skilled in the art will be able to devise various arrangements that, although not explicitly described or shown herein, embody the principles of the invention and are included within its scope. Furthermore, all examples recited herein are principally intended expressly to be for pedagogical purposes to aid the reader in understanding the principles of the invention and the concepts contributed by the inventor(s) to furthering the art and are to be construed as being without limitation to such specifically recited examples and conditions. Additionally, the term, "or," as used herein, refers to a non-exclusive or (i.e., and/or), unless otherwise indicated (e.g., "or else" or "or in the alternative"). Also, the various example embodiments described herein are not necessarily mutually exclusive, as some example embodiments can be combined with one or more other example embodiments to form new example embodiments. Descriptors such as "first," "second," "third," etc., are not meant to limit the order of elements discussed, are used to distinguish one element from the next, and are generally interchangeable. Values such as maximum or minimum may be predetermined and set to different values based on the application.

Sensors that detect physical contact of an object or object proximity within a few millimeters of the sensor are used in many applications. Uses include touch-screen displays, burglar alarms, fluid level and rain sensors, mobile phones to detect proximity of a head close to the display, gear-wheel rotation sensors for engine control, etc. Previous sensors have been based on capacitive, inductive, or optical sensing principles. In some cases an event may be combined with a form of data communication between objects that are in close proximity, as in the case in Near-Field Communication (NFC) and Body-Coupled Communication (BCC).

Figure 1:
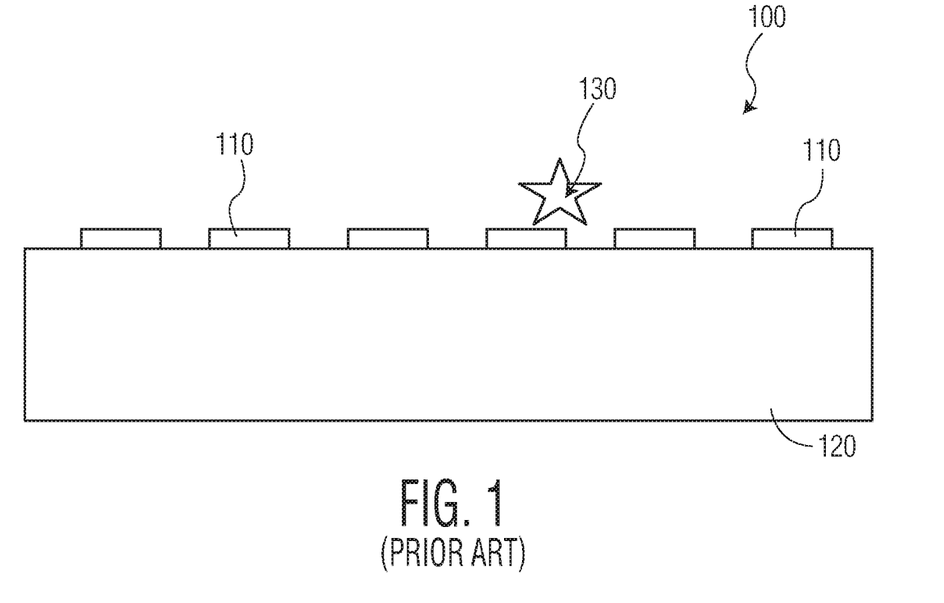
FIG. 1 illustrates a prior art proximity sensor.

FIG. 1 illustrates a prior art proximity sensor. A panel 100 is populated by an array of sensor elements 110 in accordance with prior art touch-screen displays. The array of sensor elements 110 may be disposed on a carrier substrate 120. For capacitive and inductive sensors, the array of sensor elements 110 may be in close proximity to an object being detected, which may be represented by an event 130. Sensor elements 110 often need connection to various wiring schemes that make manufacturing of these devices complex and costly. The array of sensor elements 110 disposed atop the carrier substrate 120 may also deteriorate the transparent properties of the carrier substrate 120. Large in-plane arrays may be avoided by using optical techniques that couple to an edge of the panel 100, e.g., using infrared. However, these optical techniques require lenses, III-V semiconductors, tight tolerance assembly, that add cost and complexity, and may only detect objects in physical contact to a carrier substrate plane.

In various cases, a proximity event may be detected over a large transparent area, e.g. detecting proximity or physical contact on a display or window. In some cases, the sensor may be galvanically isolated from its environment, e.g. when detecting conductive fluids or when large stray direct current (DC) field(s) are present that may cause electrostatic discharge.

Figure 2:
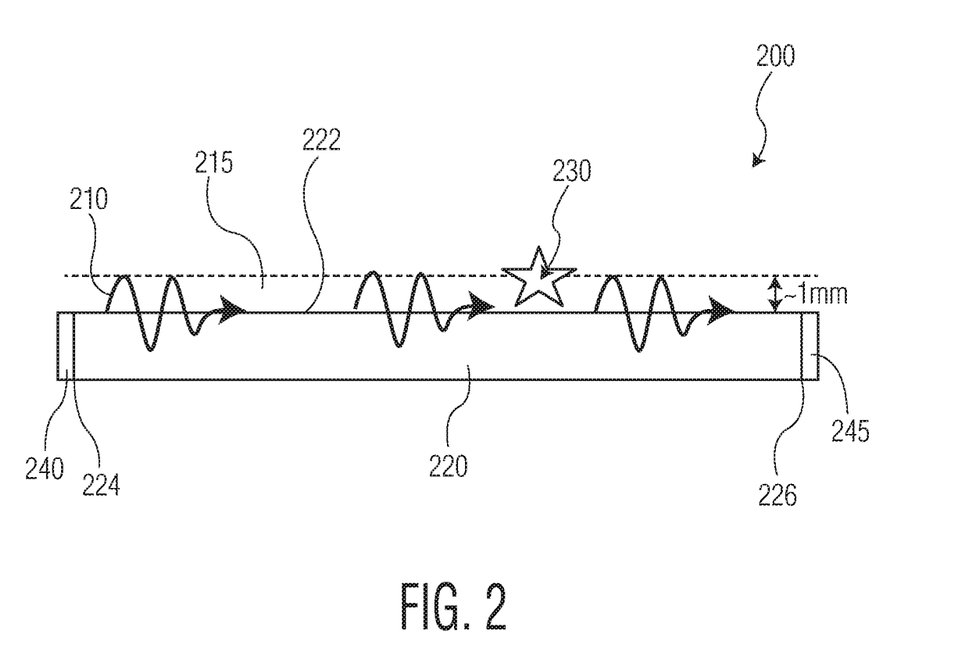
FIG. 2 illustrates an electric field sensor in accordance with example embodiments described herein.

FIG. 2 illustrates an electric field sensor 200 in accordance with example embodiments described herein. The electric field discussed herein may be known as an evanescent field, or a mm-wave evanescent field, because the field may extend to substantially one millimeter above and below a surface of a dielectric substrate. Though discussed as an electric field, the evanescent field also has magnetic components.

The electric field sensor 200 may include a dielectric sheet or dielectric substrate 220. The dielectric sheet 220 may have a plane surface 222. Example embodiments form an evanescent field 215 generated from a side coupled transceiver antenna 240. An evanescent wave 210 may propagate from the transceiver antenna 240 through the dielectric sheet 220, as well as above and below the plane surface 222 of the dielectric sheet 220. The evanescent field 215 is a non-radiating field and its field strength decays exponentially with distance perpendicular to the dielectric sheet 220. The dielectric sheet 220 may be glass, ceramic, plastic, or other insulating substrates that are known in the art. The evanescent wave 210 may be configured for detecting events in two dimensions (2D) that occur within the evanescent field 215. The decay distance in an upward and downward direction is proportional to the wavelength of the mm-wave and thus is significant up to a few millimeters away from the sheet's surface to detect event proximity. According to example embodiments, a location of an event may be determined when a liquid or other substance touches the dielectric sheet 220, and a 2D mapping of the water-air or other event interface may be performed.

At least one transceiver antenna 240 may be disposed on a side surface 224 of the dielectric sheet 220. The at least one transceiver antenna 240 may be connected to an integrated circuit (IC) chip 405 (illustrated in FIG. 4). The IC chip 405 may control the at least one transceiver antenna 240 to output and/or receive signals through the dielectric sheet 220. The IC chip 405 may also send data and control signals through the evanescent field 215. The evanescent wave 210 may spread through the evanescent field 215 from one side 224 surface of the dielectric sheet 220 to another side 226 thereof. The another side 226 may include at least another transceiver antenna 245. Proximity events may be detected by measuring changes in the evanescent field 215 caused by a change in channel characteristics between transceiver antennas 240 and 245.

Figure 3:
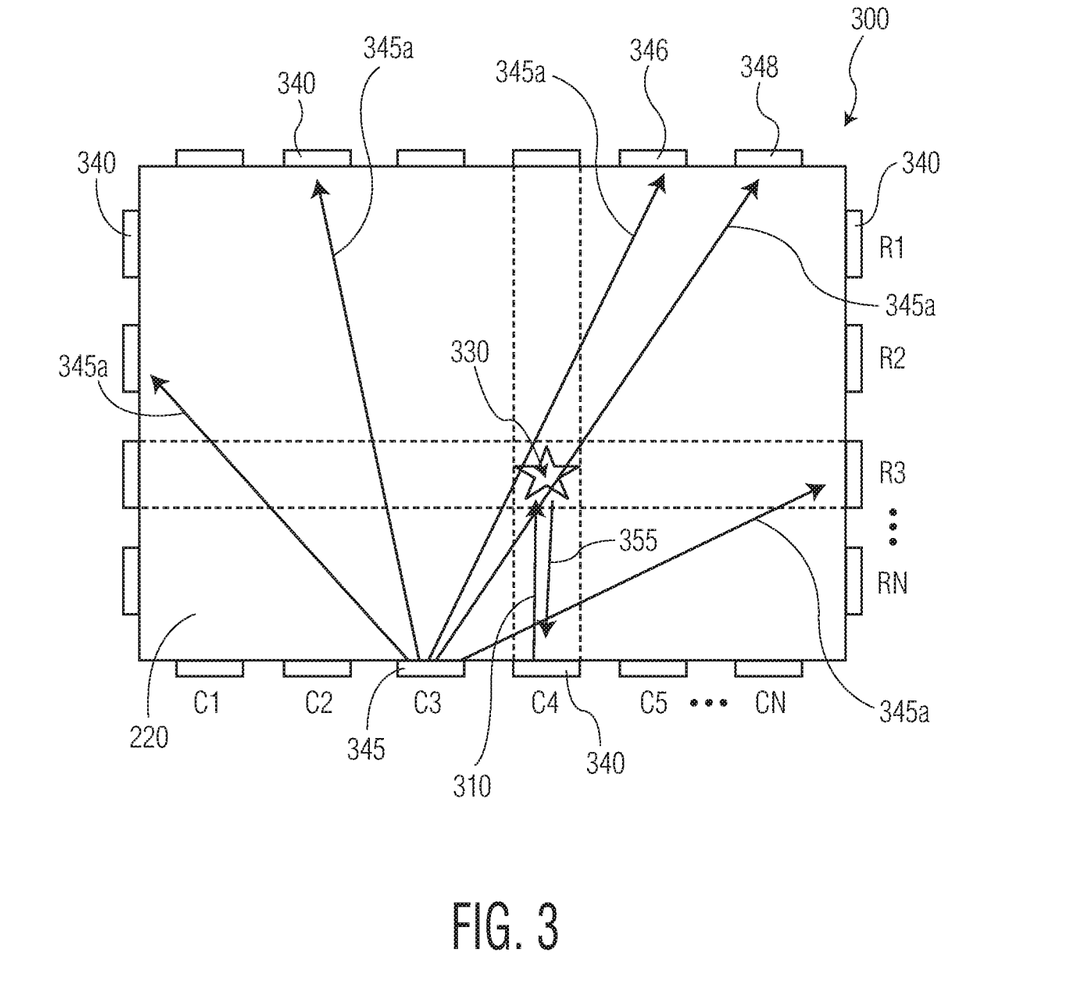
FIG. 3 illustrates event detection in 2D using an array of side-coupled mm-wave transceivers in accordance with example embodiments described herein.

FIG. 3 illustrates a top view of an array panel 300 in accordance with FIG. 2 and example embodiments described herein. FIG. 3 illustrates the dielectric sheet 220 including a plurality of side-coupled transceiver antennas 340. The transceiver antennas 340 may be disposed on four perimeter sides of the dielectric sheet 220, but embodiments are not limited thereto. Transceiver antennas 340 may be disposed on only a single side of the dielectric sheet 220, on only two sides, or only three sides, depending on designs thereof. In the situations where transceivers are not on opposite sides of the dielectric sheet 220, reflections in the evanescent field due to the event may be detected and used to determine the location of the event.

FIG. 3 illustrates a two dimensional design, in which an event 330 can be detected using a two-dimensional column and row detection. A plurality of columns C1, C2, C3, . . . CN and a plurality of rows R1, R2, R3 . . . RN may exist in a dielectric sheet of a given size. The event 330 may be detected by receiving a distorted signal at a transceiver antenna 340 in intersecting columns and rows. For example, the event 330 may be detected by receiving a distorted signal along column C4 and row R3, but embodiments are not limited thereto. The two dimensional generation and detection may fan out in a diagonal fashion across the entire surface of the dielectric sheet 220. For example, from transceiver antenna 345, an evanescent wave may be emitted in a plurality of directions 345a. As the wave is fanned out, distorted signals may be received at transceiver antennas 346 and 348. This additional information may be used to further pinpoint a location of the event 330 for detection accuracy. When no event occurs, the transceiver antenna receives a normal signal, and the wave may be said to be in a normal condition. When an event occurs, a transceiver antenna may receive a distorted signal, and the wave may be in distorted or disturbed condition. The disturbed condition may result when one or more of the evanescent waves encounters the event 330 adjacent to the dielectric sheet 220. The disturbed condition may occur for a reflected wave or a transmitted wave across the dielectric sheet 220. Encounter may mean that a portion of the evanescent wave 210 that is received by a transceiver has collided or had some interaction with the event in a manner that changed the amplitude, frequency, contents, and/or signature of the evanescent wave.

When the plurality of transceiver antennas is in use for event detection, the IC chip 405 may turn on each transceiver antenna in succession, so that the transceivers fire one at a time. Measurements may be taken at opposing and adjacent sides of the dielectric sheet 220 to determine which transceiver emitted the evanescent wave that became distorted to contribute to and therefore discover a location of the event. The successive turn on may be considered a sweep, or performed in a sweeping fashion through all the possible transceivers, one transceiver antenna at a time through all the present transceiver antennas. The sweep and measurement may take place at a rate faster than movement of an event such as a finger or droplet, and therefore be able to detect disturbances from all firing transceivers in an array. After a sweeping action has taken place, one or more receiving transceiver antennas may detect a plurality of disturbed conditions that correspond to a plurality of evanescent waves emitted from one or more transceiver antennas.

Example embodiments include a configuration and ability to reflect an evanescent wave emanated from the transceiver antenna 345, off the event 330, and back to the transceiver antenna 345.

In a given array 300 panel, one, two, three, or four sides of the array may include transceiver antennas 340. When only one side of transceiver antennas 340 is present, communication between the transceivers and an event 330 may be limited to reflection 355 of transceiver signals 310 to the event 330 and back. After one transceiver fires, evanescent waves may be transmitted from each additional transceiver antenna 340 in a sweeping manner and received from all transceivers on the single side to determine a location of the event. Timing of the transmitted and return signals may be used for event detection, as well as angles of transmittance and reception.

When transceiver antennas 340 are present on two sides, evanescent waves may be transmitted about the dielectric sheet 220 from one side to another to detect an event, and/or in a reflective manner to receive a signal that is reflected from an event. Use of three and four sides of transceiver antennas may operate in a similar fashion, using detection from across the dielectric sheet 320, detection of distorted signals, and reflection from the event. Signals may be transmitted and received from all sides in a sweeping manner to determine an accurate location of an event.

According to example embodiments, events that occur at an interface of the dielectric sheet and the transceiver antennas 340 and events that occur a few millimeters distance from the transceiver antennas 340 may be detected. Low cost CMOS and on-PCB antennas may be used to excite and detect the evanescent waves. These antennas may be mounted at edges of the array panel 300 to localize a proximity event in two dimensions over a complete dielectric sheet 220. Evanescent wave transceiver antennas 340 may be galvanically isolated from the dielectric sheet 220. This galvanic isolation allows for the detection of conductive substances coming near or touching the dielectric sheet 220 such as water or objects that have a high electric potential, e.g., electro-statically charged objects.

Figure 4:
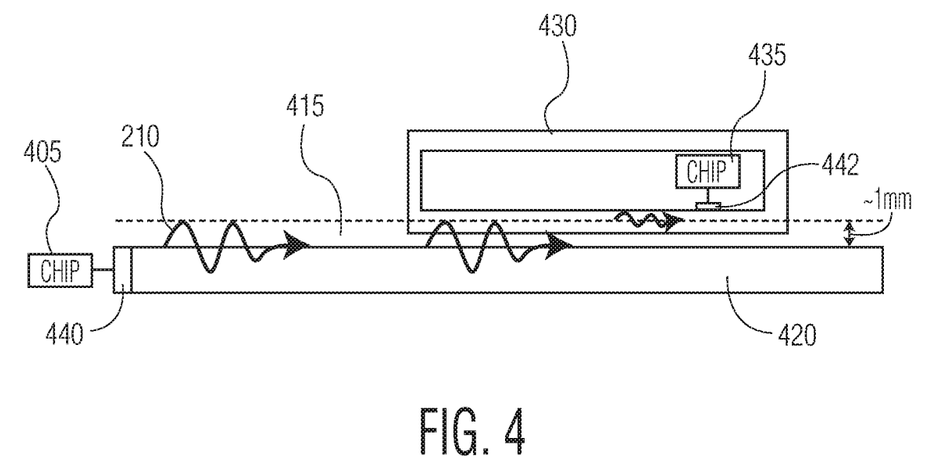
FIG. 4 illustrates short range device-to-device communication based on an evanescent field in accordance with example embodiments described herein.

FIG. 4 illustrates short range device-to-device communication based on an evanescent field in accordance with example embodiments described herein. As described herein, the IC chip 405 may signal at least one transceiver antenna 440 to emit an evanescent wave 210 through the dielectric sheet 220. In addition to detecting human touch, water droplets, and surface disturbances, the dielectric sheet 220 may be disposed on various devices such as an NFC reader to detect a proximity of a mobile or similar device 430 when the mobile device 430 comes into range. The dielectric sheet 420 may have a designated point for the mobile device 430 to interact with, or the interaction may be based on when a boundary of the mobile device enters the evanescent field 415. Though not illustrated, one or more opposing transceiver antennas may be disposed on a same side as the transceiver antenna 440 or on adjacent or opposing sides of the dielectric sheet as described herein.

The mobile device 430 may also have a dielectric sheet 420 on an exterior thereof for detection and transmission. After detecting proximity, a channel within the evanescent field 415 that is used to transmit a disturbance between two antennas may be used to transfer data from the IC chip 405 to an IC chip 435 on the mobile device through a transceiver antenna 442. The wave channels may be used for authenticating the mobile device 430 that is held in proximity to the dielectric sheet. After detecting proximity at a predetermined and authorized location adjacent the dielectric sheet surface, the same mm-wave channel can be used to transfer data and can e.g. be used for authentication. Several types of events can be detected and localized in 2D using example embodiments.

Figure 5:
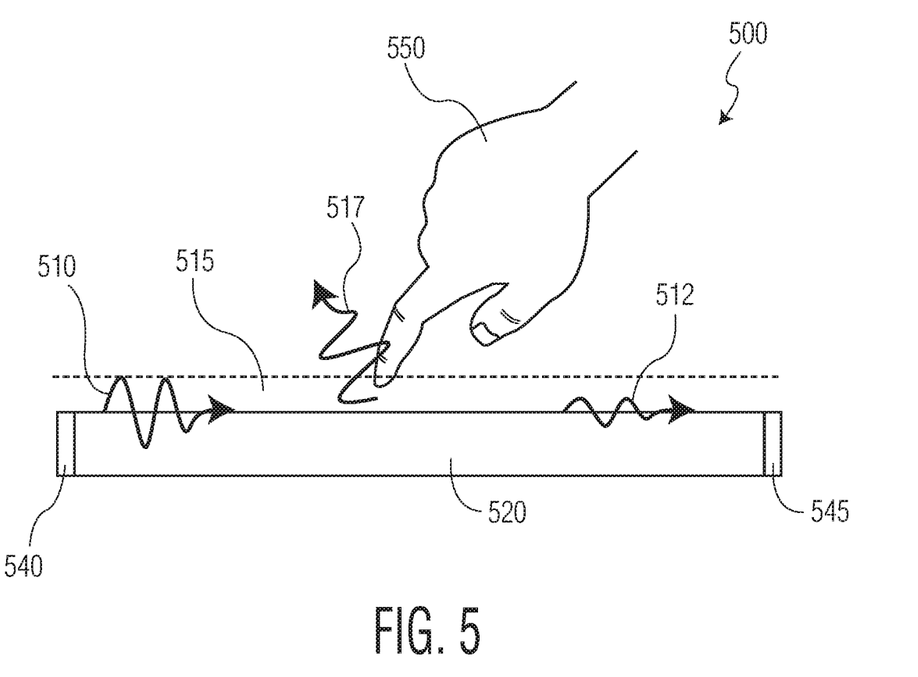
FIG. 5 illustrates proximity and touch detection using an evanescent field sensor in accordance with example embodiments described herein.

FIG. 5 illustrates proximity and touch detection 500 using an evanescent field sensor in accordance with example embodiments described herein. Human body parts such as fingers, hand palm, or face, can be detected. When detecting touch or proximity of a hand or finger, such detection may be used as a human-machine interface for large area displays. When detecting proximity rather than touch of a face on a smart phone, example embodiments may be used to disable the phone's touch screen. FIG. 5 illustrates a human finger 550 entering the evanescent field 515 and coupling, scattering, and/or disrupting waves 517 that are traveling from transceiver antenna 540 to transceiver antenna 545 The evanescent signal 512 received will be minimized and distorted from the original signal. Detection along a line from the transceiver antenna 540 to transceiver antenna 545 will identify one coordinate for event identification. Use of one or more lines between two transceivers in different directions will allow a location of the human touch disturbance to be identified.

Figure 6:
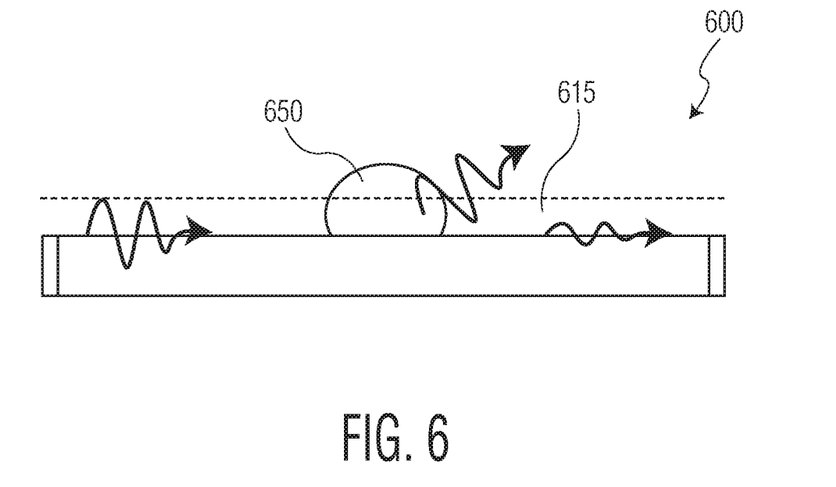
FIG. 6 illustrates a droplet detection using an evanescent field sensor in accordance with example embodiments described herein.

FIG. 6 illustrates a droplet detection 600 using an evanescent field sensor in accordance with example embodiments described herein. As one example, the sensor may be used as rain sensor on a car window to detect a water droplet 650 in the manner described herein and trigger a windshield wiper. A sensor using droplet detection 600 may also be used to detect fluid levels, such as in white goods or detection of complete immersion of electronic equipment.

Figure 7:
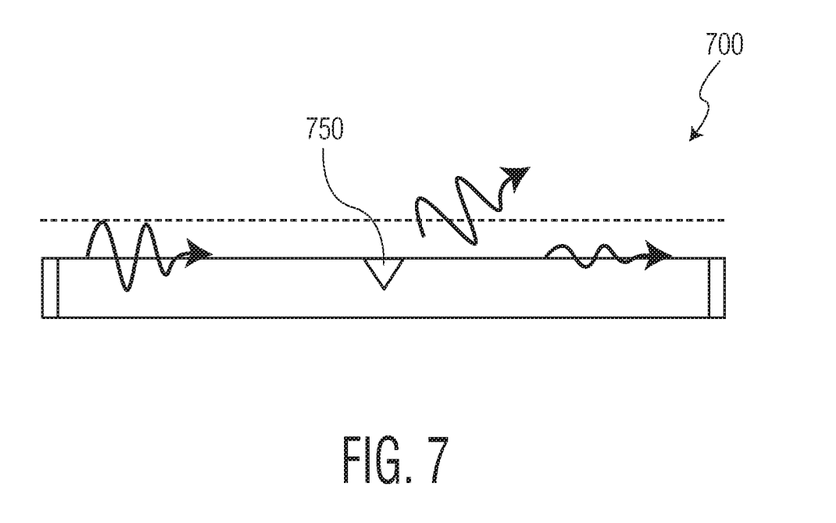
FIG. 7 illustrates surface damage detection using an evanescent field sensor in accordance with example embodiments described herein.

FIG. 7 illustrates surface damage detection 700 using an evanescent field sensor in accordance with example embodiments described herein. Surface damage 750 can be detected, for example, on house or car windows. This input can then be used to trigger tampering or burglar alarms.

Figure 8A:
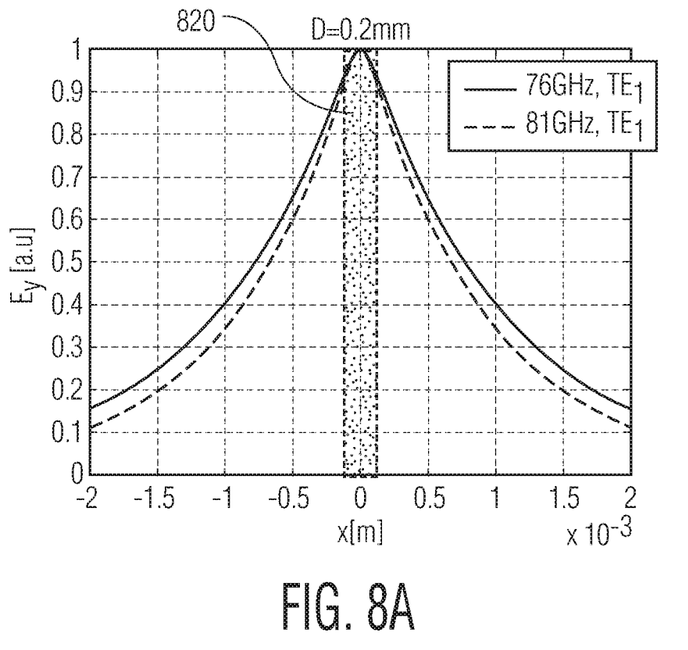
FIG. 8A illustrates mode shapes of a glass sheet with er=5.3 at 76 and 81 GHZ with thickness of 0.2 mm in accordance with example embodiments described herein.
Figure 8B:
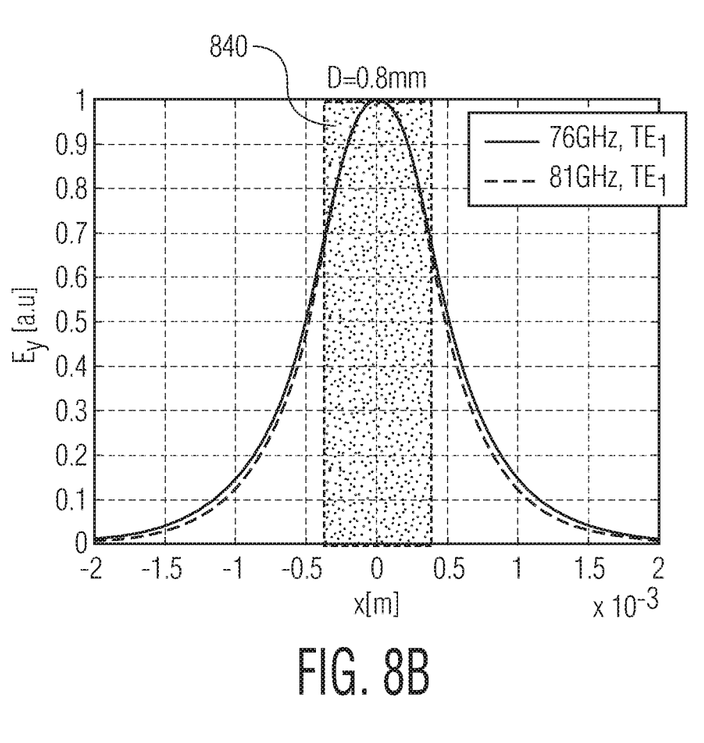
FIG. 8B illustrates mode shapes of a glass sheet with er=5.3 at 76 and 81 GHZ with thickness of 0.8 mm in accordance with example embodiments described herein.

Regarding a transmitted evanescent wave, the frequency band between 76 and 81 GHz may be used. This frequency band has been used for radar and ranging applications. FIGS. 8A-8C illustrate ranges of evanescent field strength in relation to characteristics of dielectric sheet material and dielectric sheet thickness.

FIG. 8A illustrates mode shapes of an alkaline glass sheet 820 with a dielectric constant of 5.3 at 76 and 81 GHZ with thickness of 0.2 mm in accordance with example embodiments described herein. FIG. 8A illustrates that the glass sheet 820 has a strong field over almost all of the glass sheet 820 with diminishing field strength down to about 2 mm on both sides of the sheet.

FIG. 8B illustrates mode shapes of an alkaline glass sheet with dielectric constant of 5.3 at 76 and 81 GHZ with thickness of 0.8 mm in accordance with example embodiments described herein. FIG. 8B illustrates that the glass sheet 840 also has a strong field over most all of the glass sheet 840 with diminishing field strength down to about 1 mm on both sides of the sheet. The range of the evanescent field can be further increased by decreasing the dielectric constant of the sheet material.

Figure 9:
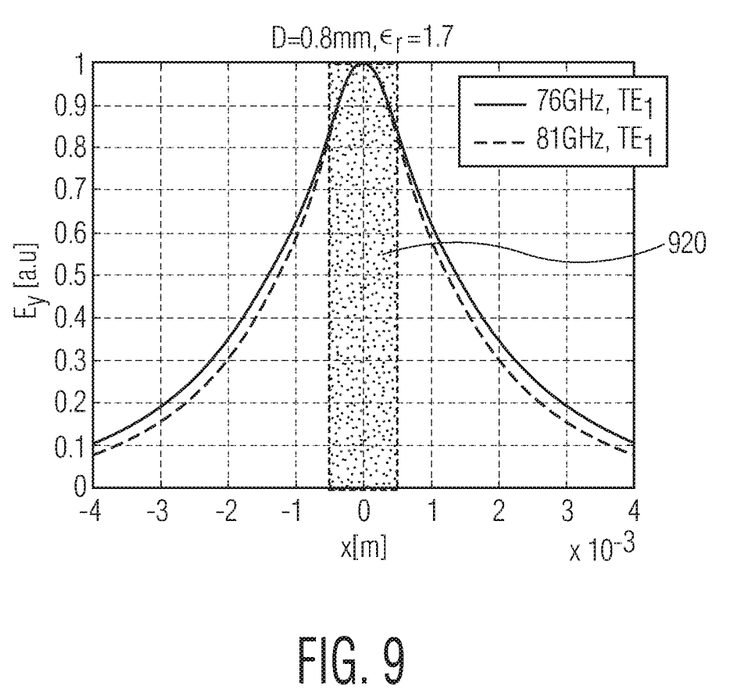
FIG. 9 illustrates mode shapes of a plastic sheet with er=1.7 at 76 and 81 GHZ with thickness of 0.8 mm in accordance with example embodiments described herein.

FIG. 9 illustrates mode shapes of a plastic sheet 920 with dielectric constant of 1.7 at 76 and 81 GHZ with thickness of 0.8 mm in accordance with example embodiments described herein. In this case, the evanescent field extents as far as 4 mm away from the sheet surface for a sheet thickness of 0.8 mm.

Figure 10A:
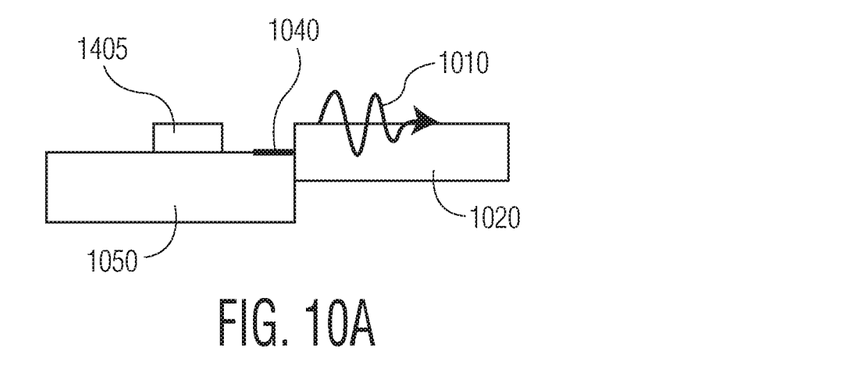
FIGS. 10A-10C illustrate several configurations coupling the mm-wave antenna between a PCB and a dielectric sheet in accordance with example embodiments described herein.
Figure 10B:
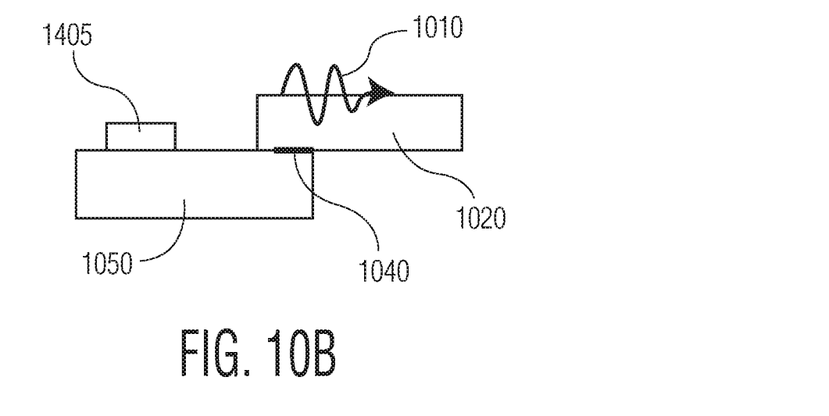
Figure 10C:
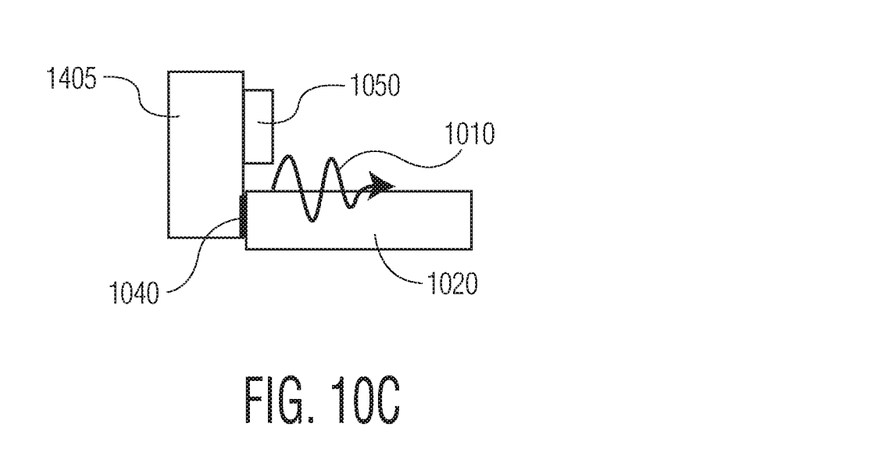

FIGS. 10A-10C illustrate several configurations coupling a mm-wave transceiver antenna 1040 between a PCB 1050 and a dielectric sheet 1020 in accordance with example embodiments described herein. Though not illustrated, one or more opposing transceiver antennas may be disposed on a same side as the transceiver antenna 1040 or on adjacent or opposing sides of the dielectric sheet 1020 as described herein.

In FIGS. 10A and 10B the transceiver antenna 1040 may be co-planar with both the PCB 1050 and the dielectric sheet 1020. In such a configuration, evanescent waves 1010 may radiate sideways from the PCB 1050.

In FIG. 10C the transceiver antenna 1040 may radiate evanescent waves 1010 in a perpendicular manner to the PCB 1050 and the evanescent waves 1010 are in-plane with the dielectric sheet 1020. As illustrated in FIGS. 10A-10C, a CMOS transceiver 1045 may be a source for transmitted waves and may receive and detect normal waves and disturbances in the waves.

Different transceiver antennas may be used for transmission and reception of the waves. A patch or dipole antenna may be used for the configuration illustrated in FIG. 10C, because the patch or dipole antenna has a radiation pattern pointed perpendicularly outward from the surface of the PCB 1050.

Figure 11:
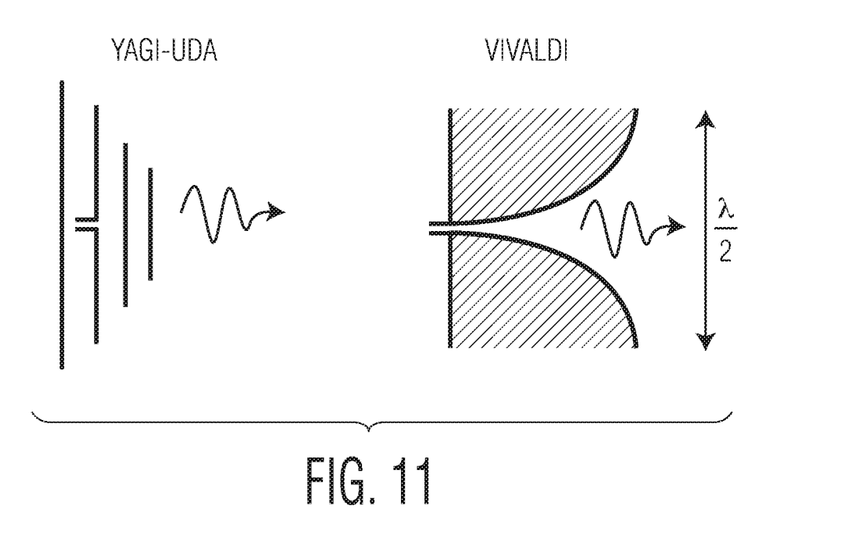
FIG. 11 illustrates a layout and dominant radiation direction of a Yagi-Uda and Vivaldi antenna in accordance with example embodiments described herein.

FIG. 11 illustrates a layout and dominant radiation direction of a Yagi-Uda and Vivaldi antenna in accordance with example embodiments described herein. A Yagi-Uda or Vivaldi antenna can be used for in-plane directional antennas such as in FIGS. 10A and 10B. These antennas have a radiation pattern that is in-plane with the PCB 1050. The in-plane direction of the radiation pattern can be chosen by appropriate orientation of their layout.

Although the various exemplary embodiments have been described in detail with particular reference to certain exemplary aspects thereof, it should be understood that the invention is capable of other example embodiments and its details are capable of modifications in various obvious respects. As is readily apparent to those skilled in the art, variations and modifications can be affected while remaining within the spirit and scope of the invention. Accordingly, the foregoing disclosure, description, and figures are for illustrative purposes only and do not in any way limit the invention, which is defined only by the claims.

The invention claimed is:

1. An electric field sensor, comprising:
   a dielectric layer having a plane surface;
   at least one transceiver antenna disposed on one side of the dielectric layer, the at least one transceiver antenna configured to emit a wave above the plane surface of the dielectric layer and detect an event adjacent the plane surface; and
   an integrated circuit coupled to the at least one transceiver antenna.

2. The electric field sensor of claim 1, wherein the at least one transceiver antenna is only disposed along one side of the dielectric layer.

3. The electric field sensor of claim 1, wherein the at least one transceiver antenna are only disposed along two sides of the dielectric layer.

4. The electric field sensor of claim 1, wherein a single transceiver antenna is configured to emit a wave toward an event and receive a reflected wave from the event.

5. The electric field sensor of claim 1, wherein the dielectric layer is a glass sheet, ceramic sheet or a plastic sheet.

6. The electric field sensor of claim 1, wherein a strength of the wave exponentially decays in a direction substantially perpendicular to the plane surface.

7. The electric field sensor of claim 1, wherein the at least one transceiver antenna is configured to receive a portion of the wave after an event disturbs the wave.

8. The electric field sensor of claim 1, wherein the wave transmits a disturbance from the event and a data message.

9. The electric field sensor of claim 1, wherein the at least one transceiver antenna emits waves in a plurality of directions along the plane surface.

10. The electric field sensor of claim 9, comprising a plurality of transceiver antennas to receive the waves.

11. A method, comprising:
    arranging a plurality of transceiver antennas around a dielectric substrate;
    emitting at least one wave from each of the plurality of transceiver antennas;
    detecting a normal condition of the at least one wave; and
    detecting a disturbed condition of the at least one wave after the at least one wave has encountered an event adjacent the dielectric substrate.

12. The method of claim 11, wherein the waves are controlled by an integrated circuit chip.

13. The method of claim 11, comprising reflecting a wave off the event to detect the disturbed condition.

14. The method of claim 11, wherein the at least one wave is an evanescent wave that extends above a surface of the dielectric substrate.

15. The method of claim 11, comprising detecting a plurality of disturbed conditions from a plurality of waves after the plurality of waves have encountered an event adjacent the dielectric substrate.

16. The method of claim 11, wherein detecting the disturbed condition results from the at least one wave has encountering a human touch.

17. The method of claim 11, wherein detecting the disturbed condition results from the at least one wave has encountering a liquid.

18. The method of claim 11, wherein detecting the disturbed condition results from the at least one wave has encountering a defect in the dielectric substrate.

19. The method of claim 11, comprising emitting a plurality of waves from each of the plurality of transmitters.

20. The method of claim 19, wherein emitting the plurality of waves is conducted in a sweeping fashion.

* * * * *